United States Patent
Thompson

(10) Patent No.: US 11,877,087 B2
(45) Date of Patent: Jan. 16, 2024

(54) METHODS AND SYSTEMS FOR REMOTE MONITORING OF ELECTRICAL EQUIPMENT

(71) Applicant: NeoGenesys, Inc., Holly Ridge, NC (US)

(72) Inventor: Randall Douglas Thompson, North Topsail Beach, NC (US)

(73) Assignee: NeoGenesys, Inc., Holly Ridge, NC (US)

( * ) Notice: Subject to any disclaimer, the term of this patent is extended or adjusted under 35 U.S.C. 154(b) by 405 days.

(21) Appl. No.: 15/240,414

(22) Filed: Aug. 18, 2016

(65) Prior Publication Data

US 2017/0054923 A1 Feb. 23, 2017

Related U.S. Application Data

(60) Provisional application No. 62/326,626, filed on Apr. 22, 2016, provisional application No. 62/206,866, filed on Aug. 19, 2015.

(51) Int. Cl.
*H04N 5/33* (2023.01)
*G01J 5/00* (2022.01)
(Continued)

(52) U.S. Cl.
CPC ............. *H04N 5/33* (2013.01); *G01J 5/0096* (2013.01); *G01J 5/025* (2013.01); *G01R 31/62* (2020.01); *G01J 2005/0077* (2013.01)

(58) Field of Classification Search
CPC .......... H04N 5/33; G01J 5/025; G01J 5/0096; G01J 2005/0077; G01R 31/027
See application file for complete search history.

(56) References Cited

U.S. PATENT DOCUMENTS 5,133,605 A * 7/1992 Nakamura ........... G08B 13/194
 374/129
8,893,216 B2 11/2014 Yadav et al.
(Continued)

OTHER PUBLICATIONS

Author Unknown, "AN/VTA-3627 VideoThermal Autonomous Detection and Ranging (VADAR) Digitally Stabilized Passive Target Acquisition System," Date Unknown, Cortex, 1 page.
(Continued)

*Primary Examiner* — Tat C Chio
(74) *Attorney, Agent, or Firm* — Muncy, Geissler, Olds & Lowe P.C.

(57) ABSTRACT

According to one aspect, a method for remote monitoring of electrical equipment includes acquiring a set of data points, each data point representing a temperature associated with a piece of electrical equipment or a component thereof, assigning each data point to one or more groups of data points, and defining an alarm metric for each group. Each group's alarm metric may be defined independently of other group's metrics. The defined alarm metrics are used to determine the health of the electrical equipment. The data may be determined from virtual probes within an infrared sensor and/or received from RFID devices containing temperature sensor, which are attached to or near the equipment to be monitored, for example. The methods described herein do not require conversion of sensor data into temperature values, and thus obviate the need for expensive sensors and/or computationally demanding conversion, compensation, and calibration routines.

17 Claims, 10 Drawing Sheets
(8 of 10 Drawing Sheet(s) Filed in Color)

(51) Int. Cl.
*G01J 5/02* (2022.01)
*G01R 31/62* (2020.01)

(56) References Cited

U.S. PATENT DOCUMENTS

| | | | |
|---|---|---|---|
| 2006/0019540 A1* | 1/2006 | Werthman | G06K 19/0717 374/E1.018 |
| 2014/0028854 A1* | 1/2014 | Heinke | G01J 5/0859 348/E5.09 |
| 2015/0124102 A1* | 5/2015 | Frost | H04N 5/33 348/165 |
| 2015/0169169 A1* | 6/2015 | Andersson | G06F 3/0488 715/765 |

OTHER PUBLICATIONS

Author Unknown, "Detect. Assess. Respond." Cortex Surveillance Automation Inc., Product Specification, Revision Mar. 2003, 2003, Cortex, 2 pages.

Author Unknown, "eClipsII™ 820 Series Network Video Recorders: 8 Channel Digital Video Recorders with Image Processing, Wavelet Compression and Integrated Internet Web Services," Cortex Surveillance Automation Inc., Product Specification, Revision Feb. 2003, 2003, Cortex, 2 pages.

Author Unknown, "eClipsII™ 1660 Network Video Recorders: 16 Channel 60 IPS Digital Video Recorders with Image Processing, Wavelet Compression and Integrated Internet Web," Cortex Surveillance Automation Inc., Product Specification, Revision Feb. 2003, 2003, Cortex, 2 pages.

Author Unknown, "eClipsII Second Generation Video/Thermal Targeting Engine," Date Unknown, Cortex, 1 bage.

Author Unknown, "eClipsII Second Generation Network Video Management," Date Unknown, Cortex, 1 page.

Thompson, Robin, "InfraMation 2015: The Leading IR Training Experience," www.sensei-solutions.com, 2015, Sensei Solutions LLC, 36 pages.

Author Unknown, "Analytic Fusion Engine for Transformers," Sensei Transformetrics: Analytic Fusion Engine for Transformers, Dec. 11, 2014, Sensei Solutions, LLC., 1 page.

Author Unknown, "Radiometric Accuracy, Real-Time and Retrospective Analysis," SensEye AVR-TR: Analytic Video Recorder for Thermography, Dec. 11, 2014, Sensei Solutions, LLC., 1 page.

* cited by examiner

METHODS AND SYSTEMS FOR REMOTE MONITORING OF ELECTRICAL EQUIPMENT

PRIORITY CLAIM

This application claims the benefit of provisional patent application Ser. No. 62/206,866, filed Aug. 19, 2015, and provisional patent application Ser. No. 62/326,626, filed Apr. 22, 2016, the disclosures of which are hereby incorporated herein by reference in their entireties.

TECHNICAL FIELD

This disclosure relates to monitoring the health of electrical equipment, such as high-voltage electrical transformers. More specifically, it relates methods and systems for remote monitoring of electrical equipment.

BACKGROUND

Electrical power grid substations often have many large, high-voltage transformers, which age over time and can fail due to short-circuits or internal high-voltage arcing—both of which may cause an explosion that destroys not only the transformer but adjacent equipment. Power companies are therefore highly motivated to detect potential failures of these large transformers and other types of electrical equipment and high-voltage electrical equipment before failure occurs. This requires continual monitoring of this equipment.

Conventional monitoring methods require the use of voltage, current, or temperature sensors attached to the transformer, which is expensive and intrusive and which increases the number of equipment that must be maintained, or require periodic analysis of samples of the oil taken from the transformer core, which is labor-intensive and time-consuming and which cannot provide real-time notification of impending failure.

Because an increase in operating temperature of a transformer is strongly correlated to failure, there have been recent attempts to remotely monitor the temperature of a transformer using infrared cameras, but these approaches suffer the disadvantage that they rely on a determination of an exact temperature reading, which is difficult to do even when using expensive IR cameras, because determination of an absolute temperature reading requires corrections to the IR sensor output to compensate for ambient temperature, corrections to compensate for whether the equipment is currently in direct sunlight or in shade, etc., as well as continual calibration of the IR sensor itself.

Accordingly, in light of the disadvantages associated with conventional approaches to remote monitoring of electrical equipment, there is a need for improved methods and systems for remote monitoring of electrical equipment.

SUMMARY

The subject matter disclosed herein includes methods, systems, and non-transitory computer readable media for remote monitoring of electrical equipment. The methods and systems described herein do not require accurate temperature readings, and may even operate on raw sensor data without conversion to a temperature value at all, and thus obviate the need for expensive sensors and/or computationally demanding conversion, compensation, and calibration routines. Data points can be logically grouped into multiple groups, each group having its own alarm metric, providing a real-time, multi-viewed analysis of equipment health.

According to one aspect, the subject matter described herein includes a method for remote monitoring of electrical equipment. The method includes acquiring a set of data points, which may also be referred to herein as "data values", each data point representing a temperature associated with a piece of electrical equipment or a component thereof, assigning each data point to one or more groups of data points, and defining an alarm metric for each group. Each group's alarm metric may be defined independently of other group's metrics. The defined alarm metrics are used to determine the health of the electrical equipment. Having multiple groups, each with its own alarm metric, allows data to be analyzed using multiple algorithms simultaneously, and allows analysis of data points from the same equipment, the same type of equipment, equipment in the same location, and/or equipment across a variety of locations, simultaneously.

According to another aspect, the subject matter described herein includes a system for remote monitoring of electrical equipment. The system includes a data acquisition module for acquiring a plurality of data points, each data point representing a temperature associated with a piece of electrical equipment or a component thereof. The system also includes a monitoring module for assigning each data point to at least one of a plurality of groups, wherein each group contains a plurality of data points, defining an alarm metric for each group, wherein at least one group's alarm metric is different from another group's alarm metric, and using the defined alarm metrics to determine a health of the electrical equipment.

The subject matter described herein may be implemented in hardware, software, firmware, or any combination thereof. As such, the terms "function" or "module" as used herein refer to hardware, software, and/or firmware for implementing the feature being described.

In one exemplary implementation, the subject matter described herein may be implemented using a computer readable medium having stored thereon executable instructions that when executed by the processor of a computer control the computer to perform steps. Exemplary computer readable media suitable for implementing the subject matter described herein include disk memory devices, chip memory devices, programmable logic devices, application specific integrated circuits, and other non-transitory storage media. In one implementation, the computer readable medium may include a memory accessible by a processor of a computer or other like device. The memory may include instructions executable by the processor for implementing any of the methods described herein. In addition, a computer readable medium that implements the subject matter described herein may be located on a single device or computing platform or may be distributed across multiple physical devices and/or computing platforms.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

Embodiments of the subject matter described herein will now be explained with reference to the accompanying drawings, wherein the like reference numerals represent like parts, of which.

DETAILED DESCRIPTION

Figure 1A:
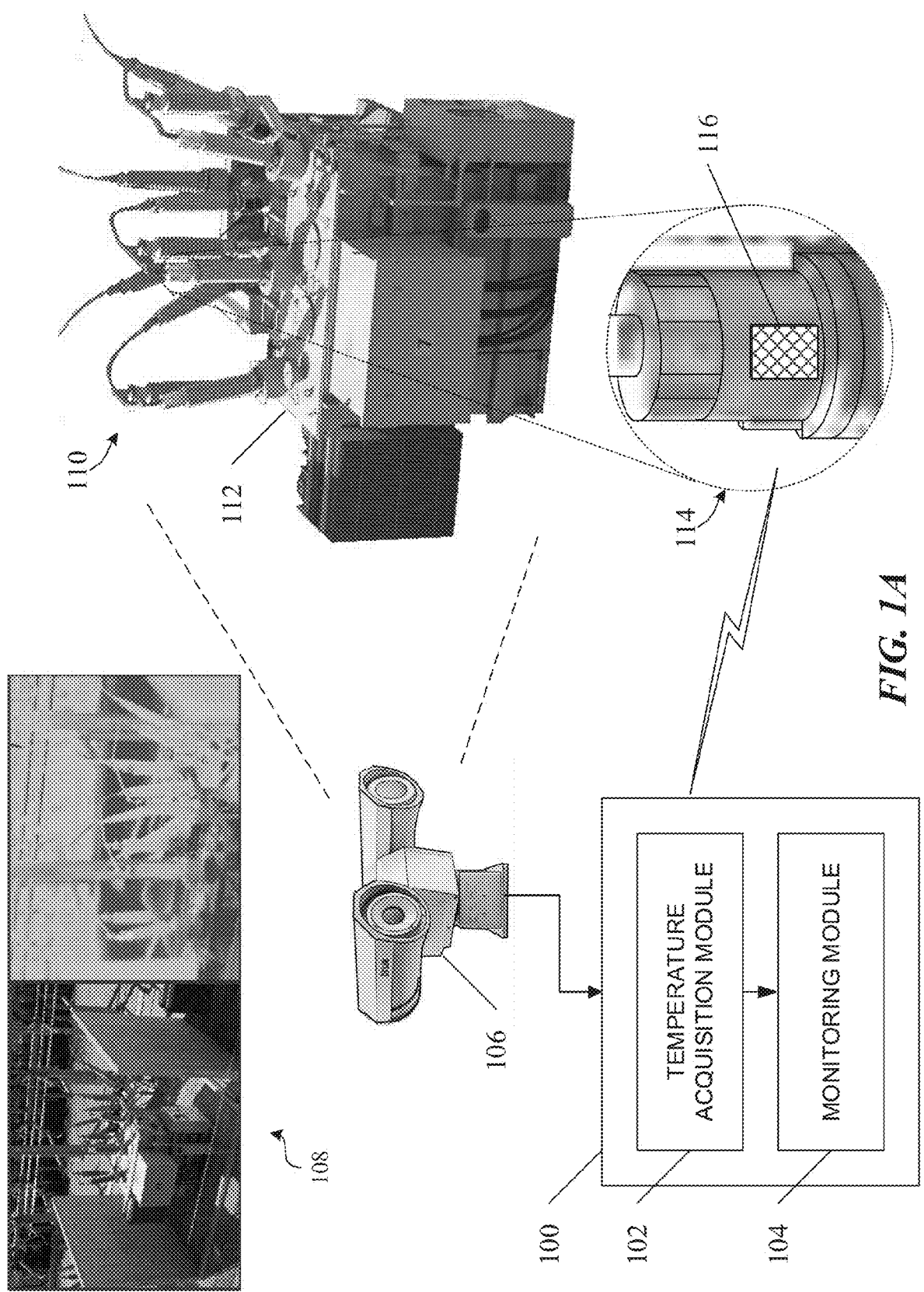
FIG. 1A is a block diagram illustrating an exemplary system for remote monitoring of electrical equipment according to an embodiment of the subject matter described herein.

Methods and systems for failure prediction of remotely monitored electrical equipment are provided herein. This methods and systems disclosed herein avoid the problems associated with determining an exact temperature reading and instead take advantage of the knowledge that similar equipment in similar conditions—e.g., multiple transformers at a single site—should exhibit approximately the same temperature characteristics, and that likelihood of failure of a particular transformer can be accurately predicted based on a relative comparison of similar equipment rather than an absolute temperature reading. For example, if one transformer is measurably hotter than its neighbors—regardless of what the actual temperature readings are—that transformer is more likely to fail. The same is true for a transformer that is measurably hotter than other transformers operating under the same or similar environment and operating conditions, regardless of whether the other transformers are physically close to or geographically diverse from each other.

Thus, unlike conventional systems that take great pains to take an exact temperature reading of a transformer and use that absolute temperature value to calculate likelihood of failure, the subject matter disclosed herein instead seeks to identify transformers that are relatively hotter than their neighbors by a threshold amount. As will be described in more detail below, the methods and systems disclosed herein allow such comparisons to be made across many collections of relative temperature measurements simultaneously and allow each comparative measurement to be associated with an independent set of comparison and alarm metrics, which provides a rich set of views by which equipment health may be monitored. Because the methods and systems described herein may operate on relative, rather than absolute, values, it is not necessary to perform computationally expensive and error-prone calibration of sensor data to an accurate absolute temperature.

Furthermore, because the mathematical analysis techniques employed herein are "data-agnostic", i.e., they work regardless of what the data values represent, the methods and systems described herein not only do not require calibration of data values to an accurate temperature, but also do not require that the data be converted to a temperature at all. That is, they methods and systems described herein can accept as input the raw data sensor in any form, and in any unit of measurement, whether it be volts, amps, lumens, charge, etc. In other words, the systems and methods of the subject matter described herein correctly detect increased likelihood of equipment failure using raw data without the need to first convert that raw data into a temperature value. As a result, systems and programs operating according to the concepts described herein can be greatly simplified and streamlined while producing equally valuable and reliable results that are comparable to results produced by much more complicated and expensive systems that require calibrated temperature values as inputs. It should be noted that while data values may be converted to temperature values to be displayed for the equipment user's convenience and ease of understanding, the conversion to temperature is not required for the analysis and detection of potential equipment failure.

FIG. 1A is a block diagram illustrating an exemplary system for remote monitoring of electrical equipment according to an embodiment of the subject matter described herein. According to one aspect, system 100 includes a temperature acquisition module 102 for acquiring a set of data points, each data point representing a temperature associated with a piece of electrical equipment or a component thereof. The data points passed to a monitoring module 104, where the data points may be assigned to groups. Each data point may belong to multiple groups simultaneously, and each group contains two or more data points. An alarm metric is defined for each group, and one group's metric may be different from another group's metric. The defined alarm metrics are used to monitor and determine the health of the electrical equipment. Upon detection of an alarm condition according to one or more of the alarm metrics, the system may notify the user of the detected alarm condition.

For example, if one terminal of a multi-terminal transformer is hotter than the other terminals by a threshold amount, this may be indicative of a potential failure of that transformer. Thus, an example alarm metric might be to generate an alarm if any data point within a group has a data value that exceeds the other data values by a threshold amount. If the data values of the data points are converted to temperatures, then the example alarm metric might be to generate an alarm if any temperature reading within the group exceeds the other temperature readings by a threshold amount. Other examples will be described below.

Data acquisition module 102 may receive data points via a variety of types of sensors. In the embodiment illustrated in FIG. 1A, for example, data acquisition module 102 may use an infrared image sensor 106 for capturing an image 108 of a scene 110 that includes a view of the electrical equipment to be monitored 112. As used herein, the term "scene" refers to a collection of real-world objects as observed by an image sensor. Thus, "a scene that contains transformers", for example, is a view, as seen by an image sensor, of a volume of space that includes transformers. Since the output of such an image sensor is a 2D (or 3D) image, the image of a scene is a representation of the actual scene. For this reason, the terms "image" and "scene" may be used interchangeably herein where the distinction can be determined by context or where the distinction is irrelevant in the context of the description.

In one embodiment, image sensor 106 may also include a visible light camera, in which case image 108 may include both a visible light view of the scene (left pane) and an infrared light view of the scene (right pane.) Data acquisition module may use the false color or grayscale image produced by infrared image sensor 106 to determine the temperature of the equipment being observed. For reasons that will be explained in more detail below, system 100 can use a technique that does not require an exact temperature reading or even conversion of the data to a temperature value. For this reason, the systems and methods described herein have a speed and cost advantage over conventional systems that rely on highly accurate temperature readings. Even if sensors used by the systems and method described herein provide numbers that purport to be actual temperature values, these values are also treated as mere numbers that are input into the calculations. No conversion or calibration to "true" temperature values is needed or performed.

According to another aspect, data acquisition module 102 may receive data points via other means. In the embodiment illustrated in FIG. 1A, for example, close up view 114 shows the use of a temperature sensor 116 that is physically attached (or proximate) to the equipment being monitored and that wirelessly transmits a temperature sensor reading to temperature acquisition module 102. In this embodiment, temperature acquisition module 102 may include a wireless receiver for wireless communication with one or more sensors 116.

In embodiment, sensor 116 may be a radio frequency identifier (RFID) device that includes or that can be coupled with a temperature sensor. RFID devices may be active or passive. For passive RFID devices, system 100 may include RFID reader functionality to interrogate the passive RFID device and read the data value being transmitted from the RFID device in response to that interrogation. Active RFID devices may transmit the data unilaterally (e.g., the RFID device is a "beacon"), in response to a query or other trigger, or other operation. Other types of wireless sensor 116 may be used.

Figure 1B:
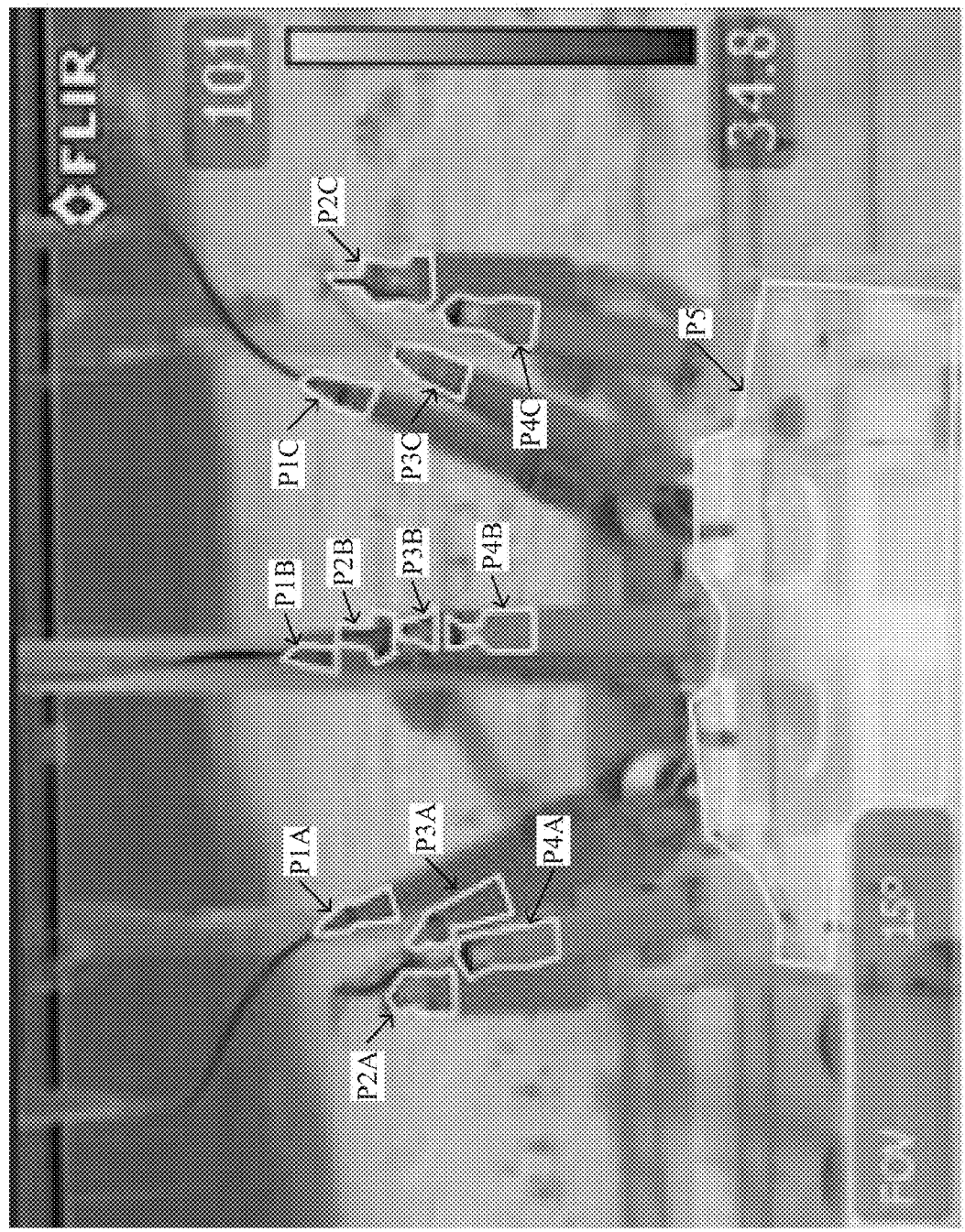
FIG. 1B is a detailed view of an infrared image of a scene in which portions of the image are defined as virtual probes that represent a portion of the equipment being monitored according to an embodiment of the subject matter described herein.

FIG. 1B is a detailed view of an infrared image of a scene in which portions of the image are defined as virtual probes (which may also be referred to as "visual probes") that represent a portion of the equipment being monitored according to an embodiment of the subject matter described herein. In the example image 118, portions of the infrared image of a piece of electrical equipment—in this case a high voltage transformer—are identified as areas of the image that represent portions of the transformer that are to be monitored. These areas, which are referred to herein as "virtual probes", are identified by white outlines. In one embodiment, the operator or user of the system manually selects the portions of the image, e.g., using a mouse, stylus, or other means to draw lines that enclose a collection of pixels within the image, as seen in FIG. 1B. In another embodiment, an image analysis algorithm may be used to identify target or potential portions of the image, which a user may or may not then manually confirm. Examples of such image analysis algorithms include, but are not limited to, edge detection, color gradient detection/contour mapping, etc.

Each virtual probe may include one or more areas that enclose a contiguous group of pixels. That is, a single virtual probe may have just one contiguous group of pixels (e.g., the probe includes just one area of the image), or it may have multiple, non-contiguous areas, each area containing a contiguous group of pixels (e.g., the probe includes multiple areas that do not touch each other). In this manner, a collection of separate areas of an image may be treated as a single unit. This is useful, for example, when it is desired to monitor the average temperature of a collection of objects within the virtual field. The same concept may be applied to group a collection of RFID devices (or the collection of data that such a group of devices would produce) as a single probe.

Although the term "virtual probe" is used throughout this document for simplicity, it will be understood that the information that is provided by a virtual probe may also be provided by a non-virtual or actual probe, e.g., by the RFID devices described above. Just as a single probe may include multiple non-contiguous areas of an image, and a single probe may include a collection of data from multiple RFID devices, a single probe may also include combinations of the above. For example, a single probe may incorporate both data from an area of an infrared image and a temperature reading from an RFID. Thus, the use of the term "virtual probe" is not intended to refer exclusively to "areas of an image" but also contemplates non-virtual probes or combinations of virtual and non-virtual probes.

In the embodiment illustrated in FIG. 1B, thirteen different portions of image 118 have been defined as virtual probes. In this example, probes P1A, P1B, and P1C represent input terminals of a first three-phase transformer and probes P2A, P2B, and P2C represent output terminals of that transformer. Probes P3A, P3B, and P3C represent input terminals of a second three-phase transformer and probes P4A, P4B, and P4C represent output terminals of the second three-phase transformer. Virtual probe P5 represents the body of the transformer(s). A color scale on the right-side of image 118 shows the correlation between the false-color infrared image and temperature values, with white/yellow representing higher temperatures and blue/black representing lower temperatures. In this example image, the body of the transformer (P5) is bright, indicating that is hotter than the terminals (P[12][ABC]), which are darker. It is noted again that data values may be converted to temperature values to be displayed for the equipment user's convenience and ease of understanding, but the conversion to temperature is not required for the analysis and detection of potential equipment failure.

Once virtual probes have been defined, they can be assigned to one or more groups of probes. Using image 118 as an example, probes P1A, P1B, and P1C may be members of a group called "T1_input", while probes P2A, P2B, and P2C may be members of another group called "T1_output". Probes may be assigned to multiple groups. For example, probes P1A, P1B, P1C, P3A, P3B, and P3C may form a group called "All_inputs"; probes P1A, P1B, P1C, P2A, P2B, P2C, P3A, P3B, P3C, P4A, P4B, and P4C may form a group called "All_terminals", and so on.

Alternatively, the non-contiguous areas of image 118 labeled P1A, P1B, and P1B could have been grouped into a single "probe", called "P1", for example. Where it is not necessary or advantageous to know the temperature of each individual terminal of a transformer, all of the terminals may instead be treated as a single probe. As stated above, any area of an image may belong to multiple probes, which means that the system may be configured to monitor each terminal separately and also monitor the group of terminals as a set, potentially with different rules, metrics, alarms, and so on, for each. Defining a single virtual probe as containing multiple non-contiguous areas, for example, also allows an object that is too large to fit on just one image—e.g., some parts of it show up in one image and other parts of it show up in another image—to be monitored as a whole unit, by defining a single virtual probe as containing multiple areas that show up in different displays or that span multiple images or displays. This is useful to measure the health of very large pieces of equipment, for example.

Each group may be assigned its own set of rules for determining the health and operation status of the equipment represented by the probes in that group. The set of rules for a group, which may define include mathematical algorithms or other tools for analysis of the probe data, is collectively referred to as the "alarm metric" for the group, since one purpose of the system is to identify potential equipment failure and alert the operator, e.g., sound an alarm, when certain conditions are detected, but the same rules may be used for other purposes as well, such as to provide a picture of general health or operation status, etc., without necessarily generating an alarm.

An alarm metric can include any type of analysis of the data points that make up the group. The following list of examples is for illustration purposes and is not intended to be limiting:

One example alarm metric compares the value of each data point in the group to the values of the other data points in the group and determines whether any one value is significantly different from the rest of the values in the group. For example, the alarm metric may look for outliers, e.g., it may calculate an average value for the group and look for data points that deviate from the average value by a threshold amount. In another example, a variance of the data points may be calculated, and an alarm raised if the variance exceeds a threshold value.

Another example alarm metric may plot a trend of data values over time and look for changes in data value that may indicate a problem. For example, an alarm metric may look for one or more data values that have a rate of data change over time higher than the rate measured for other probes in the group, which may indicate the impending failure of one phase or terminal of a transformer. Likewise, an alarm metric may set an alarm if it detects that all probes in the group show a rate of data change higher than expected, which may indicate the impending failure of the transformer as a whole.

Yet another example alarm metric compares the data values of one transformer to the data values of another transformer that is subject to the same environmental conditions, e.g., two transformers on the same site, subject to the same amount of sun, shade, cloudy or rainy weather, ambient temperature, etc., to see if one transformer is hotter than its similarly-situated neighbor. The advantage of such comparative measurements is that it is not necessary to determine an exact temperature: the system need only determine that there is a threshold difference in data values. For example, a system need only detect that transformer A is at least 20 degrees hotter, say, than transformer B: it is not necessary to determine whether their temperatures are 35° C. and 55° C., or 47° C. and 67° C., or 39.1° C. and 59.1° C., for example. The accuracy of the temperature reading is much less important than the difference in data values.

Yet another example alarm metric compares the data values of one transformer to data values of other transformers, regardless of where the other transformers are located, e.g., the other transformers could be geographically co-located or they could be geographically diverse.

Yet another example alarm metric may consider not only data values that represent measured equipment temperature but also data values that represent other aspects, such as current operating conditions of the equipment (e.g., whether it is operating at full capacity or not, whether it is operating under a full load or not, whether it is a week day, weekend, or holiday, and so on), environment (e.g., whether it is raining or not, whether there is standing water or not, and so on), and even site occupancy (e.g., whether there are people present or not, and whether intruders and/or unauthorized personnel have been detected or not). Any type of data may be considered and/or factored into an alarm metric. Furthermore, data from any source, location, and/or type may be considered, including data from locations other than the location of the equipment being monitored.

This has several distinct benefits. One benefit is that it is not necessary to use expensive, high-precision infrared cameras or other imaging devices; cheaper, less accurate infrared image sensors can be used. Another benefit is that it is not necessary to perform a conversion of the data value to a temperature at all, much less performing the difficult and/or computationally expensive calibration of the image sensor to register the image color or intensity to a precise temperature value. Likewise, algorithms and routines to adjust temperature readings based on distance from the sensor may be obviated. In FIG. 1B, for example, probes P4A, P4B, and P4C (herein referred to as "group P4") appear to be brighter than probes P1A, P1B, and P1C (herein referred to as "group P1"), but this may be an artifact due to the fact that the probes in group P1 are physically closer to the camera than are the probes in group P4. If each group includes an alarm metric that looks for variation in data value within each group, an overheated terminal will be detected correctly even without having to calculate an exact temperature value compensated for distance from the camera. This is illustrated in FIGS. 2A and 2B.

Figure 2A:
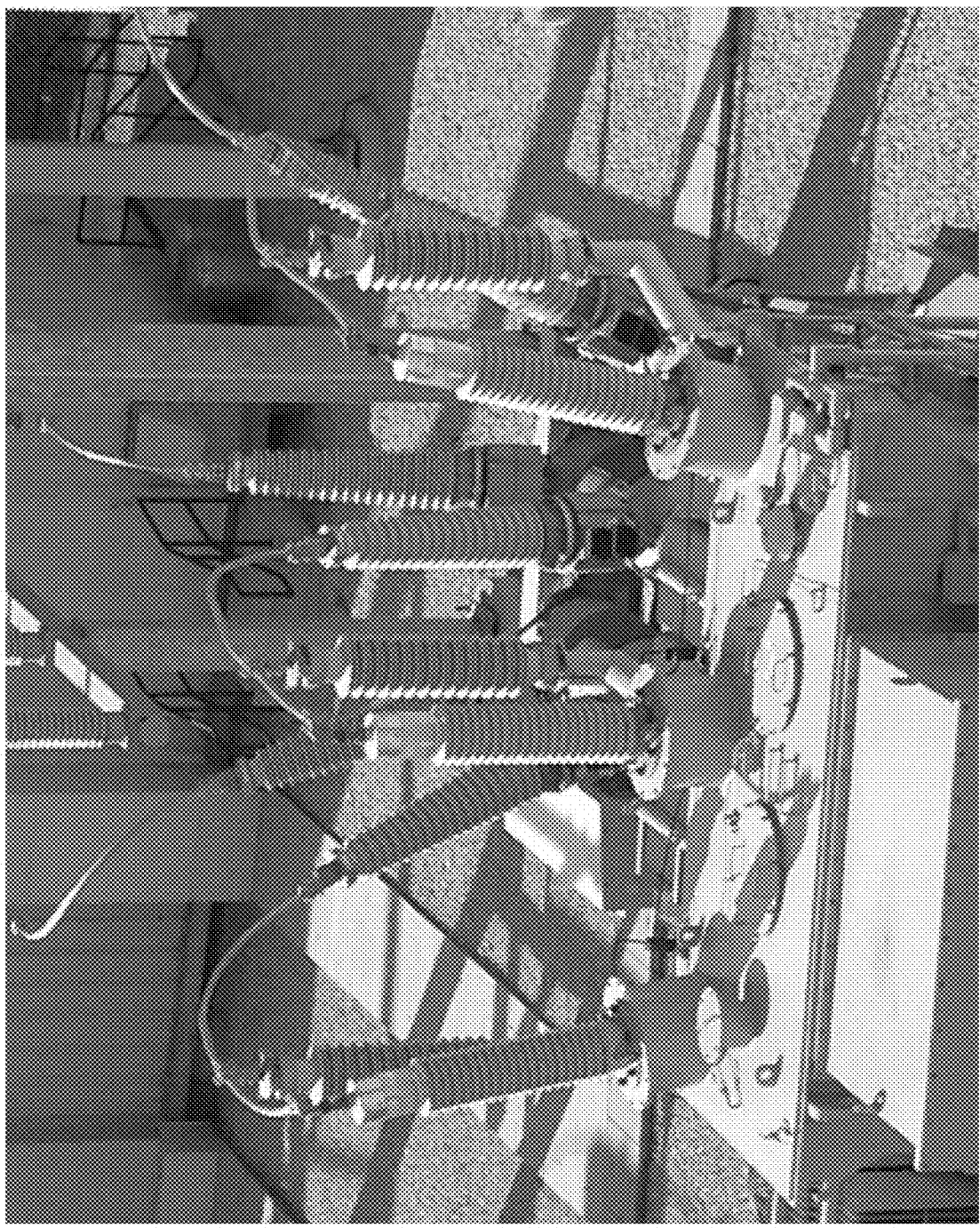
FIGS. 2A and 2B are example visible light and infrared images, respectively, acquired by an exemplary system for remote monitoring of electrical equipment according to an embodiment of the subject matter described herein.
Figure 2B:
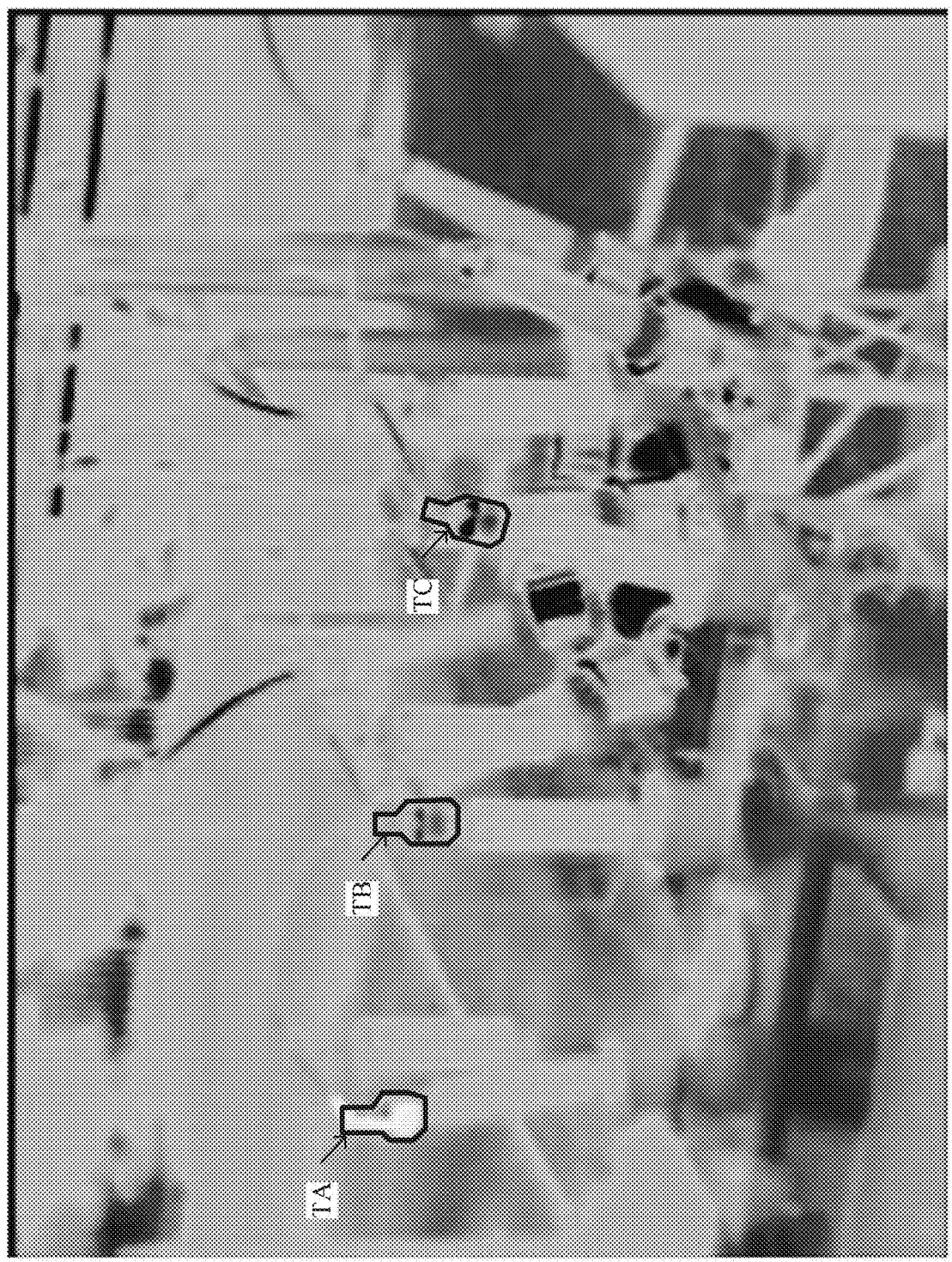

FIGS. 2A and 2B are example visible light and infrared images, respectively, acquired by an exemplary system for temperature-agnostic remote monitoring of electrical equipment according to an embodiment of the subject matter described herein. FIG. 2A shows the scene in visible light 200, and FIG. 2B shows the same or similar scene in infrared 202. The relative or absolute data value of the scene is determined based on a color (for false color images) or intensity (for black and white images) of the image.

In FIG. 2B, infrared image 202 is a view of a transformer in which three virtual probes, TA, TB, and TC, have been defined as representing the three-phase output terminals of the transformer. This image shows that one of the terminals, represented by virtual probe TA, is markedly hotter than the other two terminals represented by virtual probes TB and TC, despite the fact that all three terminals are subject to the same environmental conditions. An alarm metric that looks for deviations from the average would detect TA as being of concern, even without knowing precisely the exact temperature of TA.

In addition, the ability to include terminal TA in other groups, each group having its own alarm metric, means that each virtual probe may be subject to multiple alarm metric simultaneously, which can increase the likelihood that impending failure may be detected. For example, in the scenario where the transformer in FIG. 2B is overheating on all terminals—e.g., TA, TB, and TC are all hotter than they should be, if TA, TB, and TC are members of another group that includes terminals from other, similarly situated transformers, that alarm metric may identify all three terminals TA, TB, and TC as being outliers when compared to terminals from other transformers, and raise an alarm appropriately. The many-to-many relationship between virtual probes and groups allows enormous flexibility to provide very robust coverage and real-time or offline analysis based on multiple data points and multiple algorithms.

Figure 3:
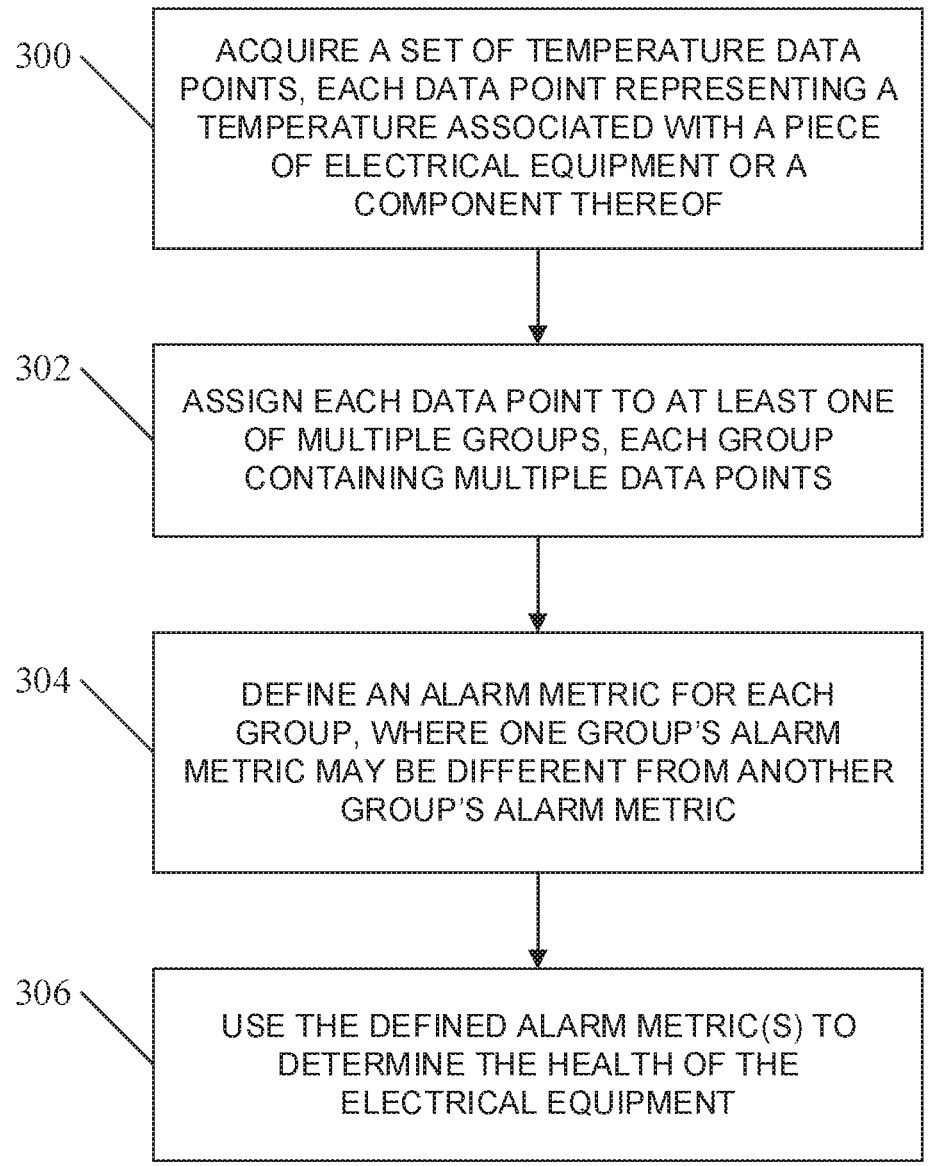
FIG. 3 is a flow chart illustrating an exemplary process for remote monitoring of electrical equipment according to an embodiment of the subject matter described herein.

FIG. 3 is a flow chart illustrating an exemplary process for remote monitoring of electrical equipment according to an embodiment of the subject matter described herein. The method includes the following steps:

At step 300, a plurality of data points is acquired. Each data point represents a temperature associated with a piece of electrical equipment or a component thereof.

In one embodiment, acquiring the data points includes using an infrared image sensor to capture a scene that includes a view of the electrical equipment, identifying, as virtual probes, portions of the captured scene that represent pieces of electrical equipment or components thereof, determining a relative or absolute data value for each virtual probe based on a color or intensity of the portion of the captured scene represented by the virtual probe, and providing the data values as at least some of the plurality of data points.

In another embodiment, acquiring the data points includes data points from a wireless sensor that transmits a data value representing a temperature of the piece of electrical equipment or portion thereof. The wireless sensor may be an RFID device that is attached to or is close to the equipment and that includes or is coupled with a temperature sensor that reads the temperature of the equipment. The RFID device may actively or passively transmit the data value for the piece of electrical equipment or portion thereof, and may transmit the data unilaterally or upon receiving a request to do so.

In one embodiment, the infrared image (and possibly also the visible light image) is displayed to a user, such as via a terminal screen or other display. The temperature of the equipment is represented by the hue (for false color displays) or intensity (for monochrome displays) of the pixel. In one embodiment, the virtual probes are also displayed to the user, to indicate which portions of the image are being treated as a representation of the equipment or a portion thereof.

At step 302, each data point is assigned to at least one of a plurality of groups, wherein each group contains multiple data points.

At step 304, an alarm metric is defined for each group. One group's alarm metric may be different from another group's alarm metric.

At step 306, the defined alarm metrics are used to determine the health of the electrical equipment, e.g., to identify electrical equipment having an increased likelihood of failure, equipment performing sub-optimally, equipment needing maintenance, etc. In one embodiment, defining an alarm metric includes determining a data value for each data point in the group, determining whether a data point has a data value that differs from a data value of at least one other data point in the group by a threshold amount, and, if so, identifying the electrical equipment represented by the identified data point as having an increased likelihood of failure.

In one embodiment, health of equipment may be determined by looking at trends over time. In one embodiment, the change of standard deviation over time (which may be referred to herein as "SIGMA*DELTA/T") of a group of data points may provide valuable information about the equipment's health. For example, if the standard deviation of the data from a group of probes changes over time such that the rate of change over a defined period changes more than a threshold amount (e.g., the data value for one or more probes begins to deviate more and more from the other probes over time) the equipment corresponding to that group of probes may be flagged as a potential candidate for failure.

To provide an easily-understood visual indicator of temperature of the equipment being monitored, a range of colors or intensity values to be displayed on a monitor or other display device may be mapped to a range of temperatures. It could also be said that the range of temperatures may be mapped to a range of colors or intensity values. For brevity of description, the term "color" will hereinafter be understood to mean "color or intensity value" unless it is clear from context that color exclusively is intended.

In one embodiment, a contiguous range of colors within the visible spectrum may be mapped across a contiguous range of temperatures. The mapping of color to temperature may be according to a linear function, a logarithmic function, an exponential function, or any other mathematical or non-mathematical function. For ease of operation, in one embodiment, the color map or intensity map may be adjusted automatically or manually by the user. For example, the range of temperatures signified by the available colors or intensity values may be expanded at the cost of resolution of data values. Likewise, the available colors or intensity values may be mapped to a smaller range of data values so that the user can distinguish temperatures at a higher resolution, but at the expense of limited range. An example of this can be seen in FIG. 1B, which displays temperatures in a range from 34.8° C. to 101° C. using a continuous range of colors from black through blue, purple, read, orange, and yellow, ending with white, as shown in the color legend that appears within the image near the right edge of the image.

In one embodiment, the user may map a range of data values to a single color or limited number of colors, where each discrete color represents a temperature or range of temperatures. This is illustrated graphically in FIG. 4.

Figure 4:
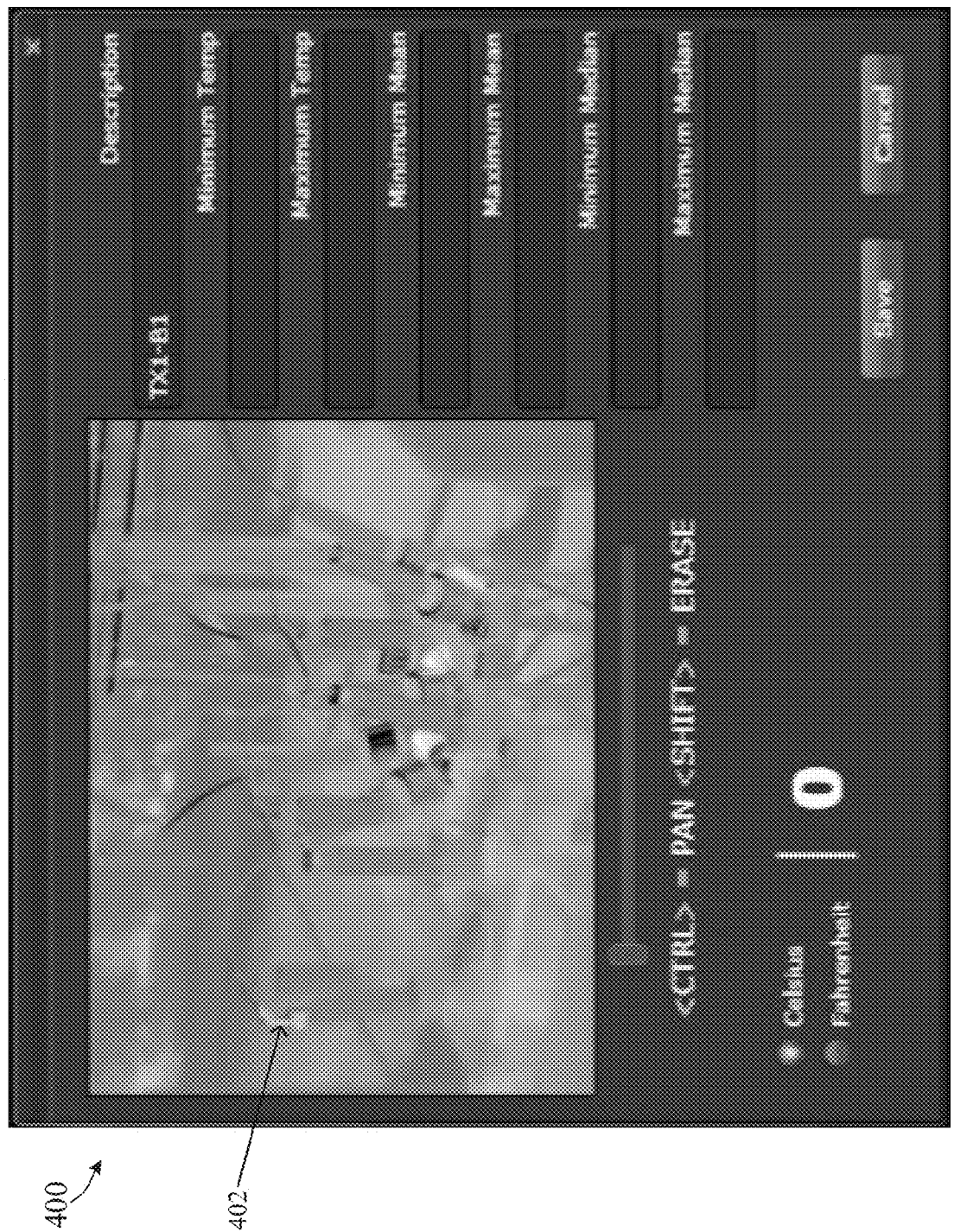
FIG. 4 illustrates an infrared image where a range of data values are mapped to a single color or limited number of colors according to an embodiment of the subject matter described herein.

FIG. 4 illustrates an infrared image where a range of data values are mapped to a single color or limited number of colors according to an embodiment of the subject matter described herein. In the embodiment illustrated in FIG. 4, infrared image 400 is subject to a color mapping algorithm that maps data values below a threshold value into a grayscale value and maps data values above the threshold value to yellow. Image 400 shows a portion 402 that is colored yellow to indicate that the data value of that portion of the equipment in the scene is above a threshold value. This technique makes it much easier for an operator to notice a high data value reading on the infrared image when compared to viewing a full color infrared image, such as is shown in FIG. 2B. In other examples, data values may be mapped to yellow, orange, and red, corresponding to temperatures that are slightly higher than normal, higher than normal, and much higher than normal, for example. The ranges of temperatures assigned to the colors need not be contiguous. For example, one color may be used to display temperatures that are below a first threshold and another color may be used to display temperatures that are above a second threshold that is higher than the first threshold, and temperatures between the first and second thresholds are displayed in greyscale (or perhaps not displayed at all).

Figure 5A:
FIGS. 5A, 5B, and 5C illustrate example screen shots from a user display of an exemplary system for remote monitoring of electrical equipment according to embodiments of the subject matter described herein.
Figure 5B:
Figure 5C:
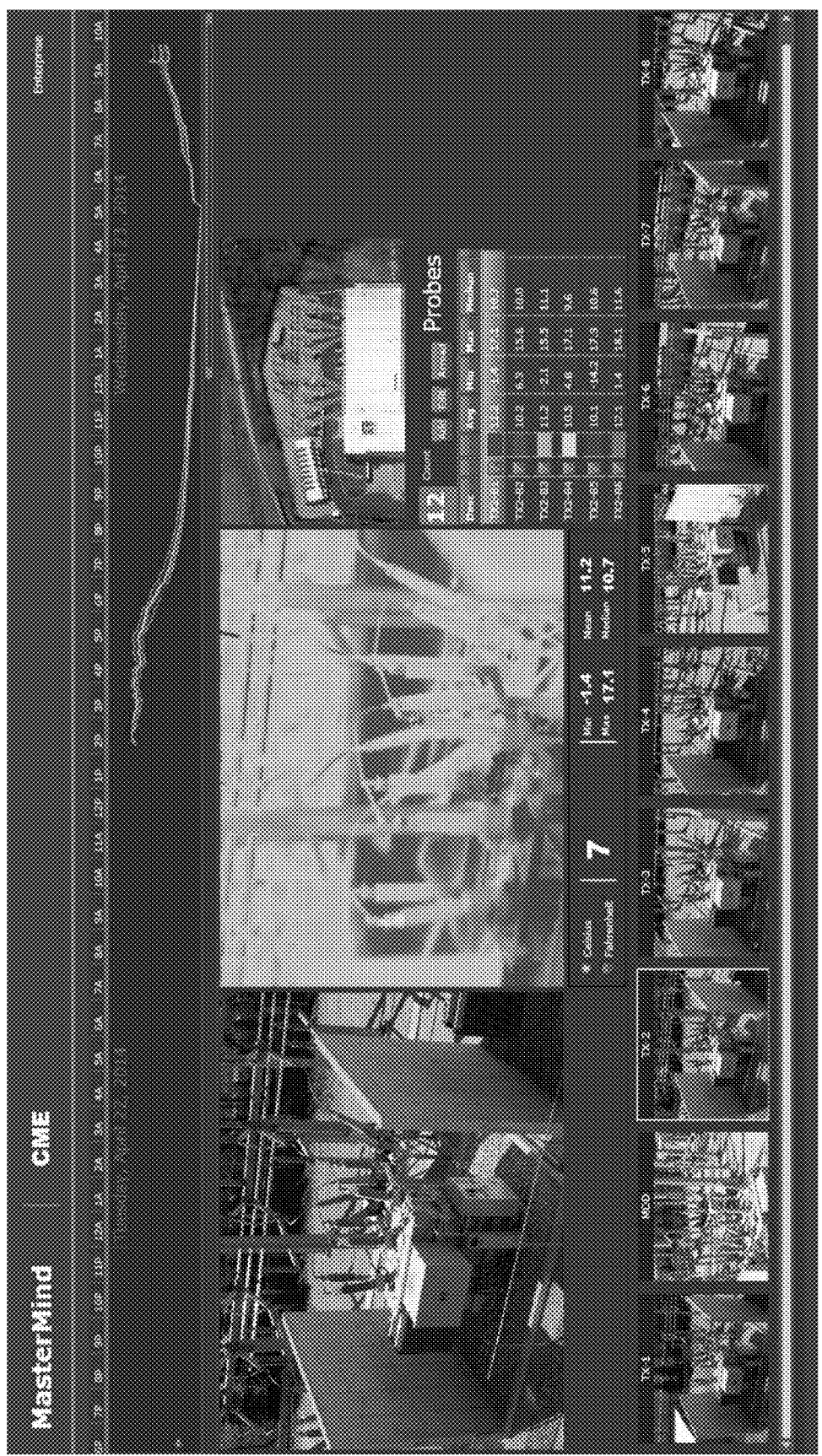

FIGS. 5A, 5B, and 5C illustrate example screen shots from a user display of an exemplary system for remote monitoring of electrical equipment according to embodiments of the subject matter described herein. In FIG. 5A, an example graphical user interface includes several panels, such as a graph of historical temperature data (top panel), a selection of different views to choose from (bottom panel), and information about the currently selected view (middle panel.) In the embodiments illustrated in FIGS. 5A, 5B, and 5C, the middle panel includes a visible light image (left), a thermal image (center), and a site map showing the available images and their relative locations to each other (right). During operation, a user selects a view, either from the views on the bottom or the map on the middle right. This causes the middle left and center panels to change to show the visible light image and thermal image, respectively, of the selected view.

The methods and systems disclosed herein may be implemented using hardware or hardware in combination with software and/or firmware. The functions described herein may be performed by one or more hardware modules.

Figure 6:
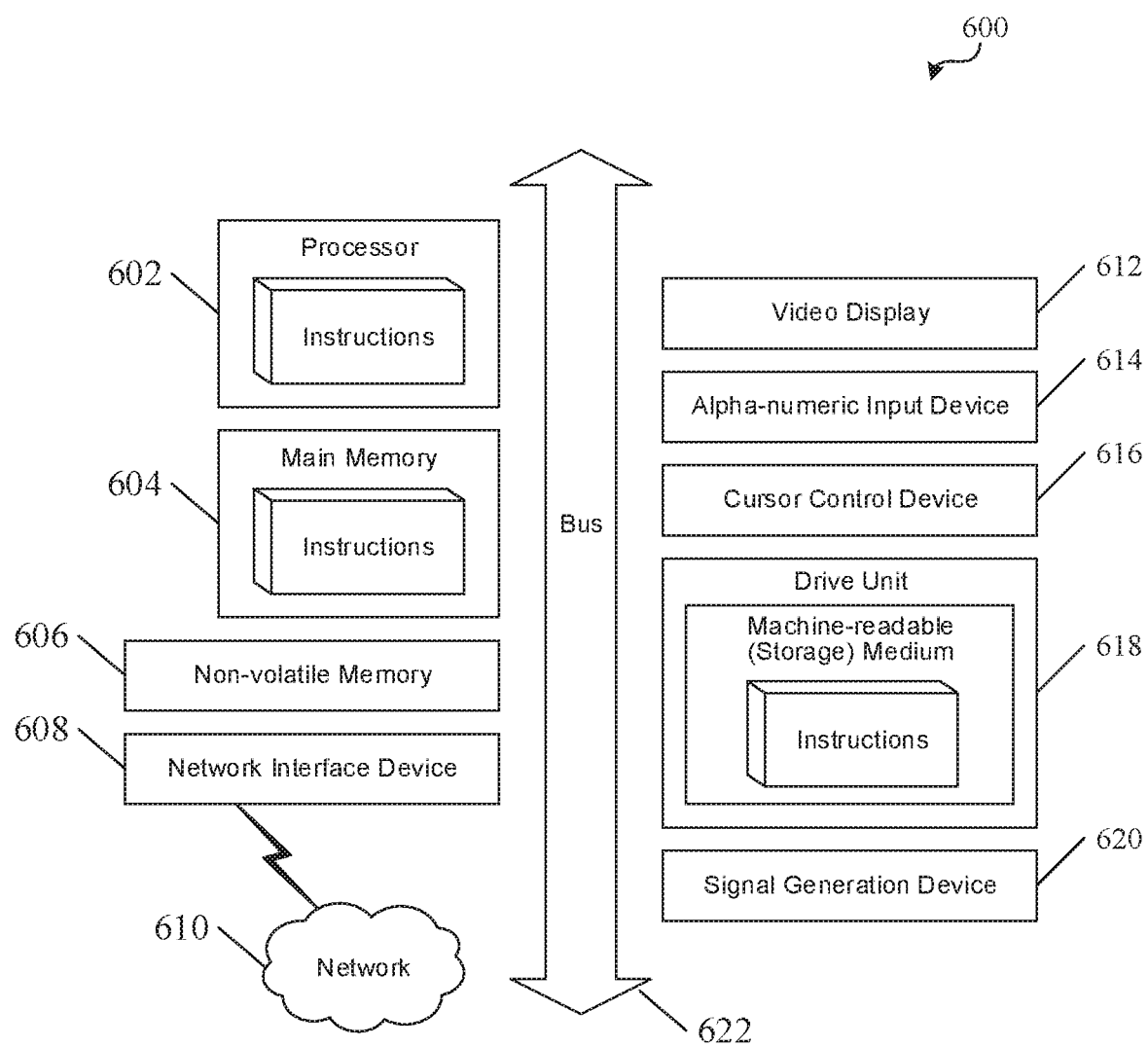
FIG. 6 is a block diagram of an exemplary hardware module for performing a function described herein.

FIG. 6 is a block diagram of an exemplary hardware module for performing a function described herein. In the embodiment illustrated in FIG. 6, hardware module 600 may include a processor 602 that executes instructions that may be stored locally and that may be fetched from main memory 604. Main memory may be volatile, non-volatile, or a combination of the two. System 600 may include non-volatile memory 606, such as ROM, EPROM, EEPROM, FLASH, and the like. System 600 may include a network interface device 608 for communicating over a network 610. System 600 may include a video display 612, which may be used to provide a graphic user interface (GUI) to a user, an alphanumeric input device 614, such as a keyboard, and a cursor control device 616, such as a mouse, pointer, stylus, touch screen, etc. System 600 may include mass storage, such as a hard disk drive or solid state drive 618, which may be used to store instruction code. System 600 may include a signal generation device 620 or other peripheral for communicating with or controlling external devices. The modules of system 600 may communicate with each other via one or more busses 622.

Calculating a temperature differential is much easier and less rigorous than calculating an exact temperature. For example, it is relatively easy to calculate that one transformer is 20 degrees hotter than another, but relatively hard to determine whether the temperatures of the two transformers are 80 degrees and 100 degrees, or 85 degrees and 105 degrees, or 77 degrees and 97 degrees, etc. By using temperature differentials, calculation of exact temperature values (and all of the associated adjustments, compensations, and calibrations that this calculation entails) is obviated. Moreover, by using data differentials—e.g., using raw sensor data before it is converted to temperatures at all—the detection of the relative health of the equipment may be performed more simply and quickly but with equal reliability as prior art techniques which take great pains to ensure accurate temperatures from sensor data.

The additional benefit of this method is that it is now possible to take a single infrared image, or "scene"—of multiple transformers in the same facility, for example—and partition it into multiple areas of interest, or "probes", and detect potential failures based on differences of temperature between one set of pixels (one probe) and another set of pixels (another probe) using relatively inexpensive IR cameras, such as those used for surveillance instead of expensive IR cameras used for temperature measurements. No physical contact with the equipment being monitored is necessary—no sensors, no physical probes, no extraction of transformer oil for analysis needed.

Finally, because relatively inexpensive, surveillance-type IR cameras may be used, it is possible to use the same IR camera for both temperature monitoring and intrusion detection.

Sensor Fusion. Sensor Fusion is a term used by Sensei Solutions, LLC (hereinafter referred to as "Sensei Solutions"), to refer to the process of combining signal data from two or more sensors or systems operating in different spectra so as to discriminate between individual sensor-induced noise, and the confirmation of actual occurrence across a heterogeneous population of collocated sensors within a specific period of time. Sensor Fusion is also a term used by Sensei Solutions to refer to a line of products that provide, use, or support this process.

The importance of Sensor Fusion. Regardless of type or manufacturer, even the most sensitive, exotic and expensive sensors produce false signals (or "noise") under certain circumstances. Better sensors produce fewer false signals and may claim superior SNR (signal-noise ratio), but no sensor is immune to false stimulation under the right circumstances. Thus, any system which relies solely on one class of sensor is inherently incapable of exceeding the reliability of the weakest or noisiest sensor to which it is connected, and will be prone to false detection at a rate defined by the sensor's SNR.

The process of Sensor Fusion can significantly improve the certainty of valid detections and suppression of noise, by enforcing a logical protocol which requires detection of signals from two or more collocated sensors across two or more spectra within a certain period of time. Coincidental signals from collocated sensors indicate a much greater likelihood of valid detection—approximately an order of magnitude greater reliability for each spectra in which the phenomena is detected.

Sensor Fusion is important as a tool to reduce noise-induced false alarms, and increase reliability in any sensor-based automation system.

Application to Real-World Problems. Such a dramatic improvement is SNR directly affects the feasibility and economics of any sensor-based automation system, from CBM (condition-based Maintenance) to IDS (Intrusion Detection) and ESI (Electronic Signals Intelligence).

Two examples of the benefits which may be realized from deployment of Sensor Fusion are Physical Security and Condition-based Monitoring of critical infrastructure such as electrical substation equipment (Power Transformers, Breakers, Bushings etc.), generation assets (Turbines, GSUs) and transmission assets (Towers and transmission lines).

Sensor Fusion for Physical Security. In the Physical Security realm, Sensor Fusion may be applied to processing of the signal data from conventional IDS (Intrusion Detection Systems) such as PIRs, BLS (Buried-line and fence sensors) Video Analytics, GSR (Ground Surveillance Radar) and GDS (Gunshot Detection Systems). Each of these sensors operate in different spectra—PIRs and Thermography in the infra-red spectrum, BLS in the seismic, video analytics in the visible spectrum, GDS in the audible and radar in the GHz spectrum. Accordingly, properly configured sensors of complementary classes may be deployed to virtually eliminate the propagation of false signals produced by either individual sensor. This strategy has proven extremely effective when combining inexpensive PIR sensors with video analytics, and all the more so with the addition of GSR.

Sensor Fusion for CBM. The second example is the use of sensor fusion to verify equipment condition of critical assets like high-voltage power transformers. These devices are typically cooled by circulation of dielectric mineral oil around the cellulose-insulated windings inside the main tank of the transformer. In a healthy transformer the mineral oil will contain only minuscule levels of gases in solution. However, if the transformer has suffered any sort of electrical or mechanical insult (overloading, voltage-spike/impulse or physical damage from collision) the internal windings and their insulators may be damaged. Such damage typically takes the form of a breakdown in the cellulose insulation, and/or the shorting of some portion of the windings to the transformer tank/ground. In the first case, cellulose which has been stressed by overheating will release carbon dioxide and carbon monoxide. In the second case even the smallest short can result in arcing through the mineral oil—an event referred to as "Partial Discharge". This partial discharge results in a phase-change of the dielectric mineral oil to gas. This phase change produces a number of gases, many of which are highly explosive, even in minute quantities such as hydrogen, methane, ethane and acetylene. Sensors to measure the concentration of these gases in the dielectric solution called DGA (Dissolved Gas Analysis) producing readings based on samples drawn every four hours or so. Much can be determined about the health of the transformer based on the quantity and proportion of these gases; however it is an inexact science due to perfectly normal variations in what is normal from one transformer type and model to the next. Because of these wide variations only broad guidelines exist for safe vs. dangerous concentration of these gases, and except in the most extreme cases the DGA data alone is not sufficiently reliable to automatically make a decision to take a power transformer out of service, with the decision ultimately coming down to the experience of the engineer interpreting the data.

Sensor Fusion may be applied to this problem by fusing data from other sensors such as partial-discharge acoustic or RF sensors with the DGA, or by comparison across a number of transformers of the same make and model operating under similar conditions (environment and load). In the case of high-voltage transformers the economic consequences of decommissioning a working asset is only secondary to an actual failure of the transformer—neither is desirable or acceptable, and systems which "cry wolf" are short-lived.

Multiple Sensors, Multiple Algorithms, Single View. Sensei Solution, LLC owns and produces a Transformetrics™ application module that provides single-dashboard access to all of the instrumentation data collected by Sensei Solutions' MasterMind™ platform from any number of sensors and IED's deployed on a transformer, including DGA, Partial Discharge, Load, Temperatures and Bushing Monitors. A wide variety of sensors and IEDs are supported including devices from companies such as Kelman/GE, Serveron, Morgan-Schaeffer, Mistras, and Doble.

Any number or combination of user-provided and industry-standard algorithms may be applied to the sensor data, with the results graphically annotated and superimposed on the relevant data series. Out-of-the-box support for Duval Triangle and Rogers Ratios is provided, and may be augmented by any number of algorithms available from the Institute of Electrical and Electronics Engineers (IEEE) and other professional engineering organizations.

High Confidence, High Reliability. The only thing worse than an unexpected outage is an unnecessary outage. Because different algorithms respond to different circumstances with varying degrees of accuracy, any one algorithm can indicate fault conditions where none actually exists. Sensei Solutions' proprietary analytic fusion engine reduces ambiguity and increases confidence by continuously cross-checking analytic results with multiple algorithms and methods which together significantly reduce the likelihood of an unnecessary service interruption, while increasing the likelihood of a valid detection in time to take preventative measures.

Intuitive Graphical Interface. All of the information pertinent to transformer health can be viewed and compared at-a-glance. Key summary information for each individual data point is presented in either tabular or graphical form, with 5, 15, and 30-day trends automatically calculated and stored for each data element.

Optimized For Large Data Sets. Sensei Solutions' MasterMind™ User Interface is designed specifically to handle massive data sets while rendering responsive and informative virtualizations for any number of series or elements. Instantly access years' worth of sampling data, and effortlessly perform retrospective analysis with eye-popping graphics and state-of-the-art algorithms.

Scalable, Enterprise-Ready Architecture. No other automation information system provides the level of scalability and flexibility achieved by Sensei Solutions' MasterMind™ Surveillance Automation Platform. MasterMind™ processors scale from the field to the command center, and everywhere in-between, with software-adapter interfaces for many IEDs and Enterprise-class systems.

Rugged Package, Flexible Form-Factor. MasterMind™ host processors may be deployed as solid-state embedded devices at the edge of the network collecting and analyzing real-time data on-site, and they may also be deployed on the desktop for historical analysis, or in the data center for access to corporate databases, and in the command center for real-time depiction of site/device status.

What is claimed is:

1. A method, performed by processing circuitry, for remote monitoring of electrical equipment, the method comprising:
   receiving a scene, provided by an infrared (IR) camera, of an image of electrical equipment to be monitored, the electrical equipment comprising at least one of a transformer, a bus bar, or a metal conductor within an electrical power substation;
   partitioning the scene into a plurality of fixed, non-overlapping areas, each area comprising a fixed set of pixels that displays a fixed portion of the electrical equipment to be monitored;
   assigning each of the plurality of areas to one or more groups, each group containing at least two of the plurality of areas;
   acquiring a plurality of data values, one for each of the fixed, non-overlapping areas, by determining a minimum, maximum, or average intensity of all of the pixels contained within the respective fixed, non-overlapping area without converting the intensity values to temperature values;
   defining an alarm condition for each of the one or more groups, wherein each alarm condition defines a condition indicative of potential equipment failure of which the operator should be alerted, based on an analysis of the data values of the fixed, non-overlapping areas assigned to that group, wherein the alarm condition for each of the one or more groups comprises at least one of:
      detecting that a variance or standard deviation of data values from the fixed, non-overlapping areas in the group exceeds a threshold amount;
      detecting that a change of variance or standard deviation of data values from the fixed, non-overlapping areas in the group over time exceeds a threshold rate;
      detecting that a variance or standard deviation of data values from the fixed, non-overlapping areas in the group differs from a variance or standard deviation of data values from the fixed, non-overlapping areas in another group by a threshold amount;

detecting that a change of variance or standard deviation of data values from the fixed, non-overlapping areas in the group over time differs from a change of variance or standard deviation of data values from the fixed, non-overlapping areas of another group by a threshold amount; or detecting that data values from the fixed, non-overlapping areas in a first group differ from data values from the fixed, non-overlapping areas in a second group by a threshold amount, wherein the first group corresponds to portions of a first equipment and the second group corresponds to portions of a second equipment, and wherein the first equipment and second equipment are subject to a same set of environmental conditions;

detecting that the alarm condition for one of the one or more groups has been met; and in response to detecting that the alarm condition for one of the one or more groups has been met, providing an operator alert that the alarm condition for the one of the one or more groups has been met.

2. The method of claim 1, wherein a value of at least one of the plurality of data values is converted to a temperature value.

3. The method of claim 1 including providing, to the operator, a display that shows an image of the scene provided by the IR camera and a visual indication of the plurality of fixed, non-overlapping areas.

4. The method of claim 3, wherein a hue or intensity of a pixel of the image represents a static data value or a static range of values corresponding to a temperature or a range of temperatures of the electrical equipment at that location in the image.

5. The method of claim 4 including adjusting an intensity map or color map of the image to increase a range or sensitivity of the data values being represented to the user.

6. The method of claim 4 including mapping a sub-range of data values to a single color or intensity value.

7. The method of claim 4 wherein data values in a first sub-range are displayed in color and wherein data values in a second sub-range are displayed in grayscale or black and white.

8. The method of claim 1 wherein acquiring the plurality of data values further comprises acquiring at least one additional data value from a sensor that is attached to the electrical equipment to be monitored and assigning the at least one additional data value to at least one of the one or more groups.

9. The method of claim 8 wherein the sensor comprises a radio frequency identification (RFID) device for transmitting the data value.

10. An apparatus, comprising:
an infrared (IR) camera;
a memory; and
at least one processor communicatively coupled to the IR camera and the memory, the at least one processor configured to:
receive a scene, provided by the IR camera, of an image of electrical equipment to be monitored, the electrical equipment comprising at least one of a transformer, a bus bar, or a metal conductor within an electrical power substation;
partition the scene into a plurality of fixed, non-overlapping areas, each area comprising a fixed set of pixels that displays a fixed portion of the electrical equipment to be monitored;

assign each of the plurality of areas to one or more groups, each group containing at least two of the plurality of areas;

acquire a plurality of data values, one for each of the fixed, non-overlapping areas, by determining a minimum, maximum, or average intensity of all of the pixels contained within the respective fixed, non-overlapping area without converting the intensity values to temperature values;

define an alarm condition for each of the one or more groups, wherein each alarm condition defines a condition indicative of potential equipment failure of which the operator should be alerted, based on an analysis of the data values of the fixed, non-overlapping areas assigned to that group, wherein the alarm condition for each of the one or more groups comprises at least one of:

detecting that a variance or standard deviation of data values from areas in the group exceeds a threshold amount;

detecting that a change of variance or standard deviation of data values from areas in the group over time exceeds a threshold rate;

detecting that a variance or standard deviation of data values from areas in the group differs from a variance or standard deviation of data values from areas in another group by a threshold amount; or detecting that a change of variance or standard deviation of data values from areas in the group over time differs from a change of variance or standard deviation of data values from areas of another group by a threshold amount; or detecting that data values from areas in a first group differ from data values from areas in a second group by a threshold amount, wherein the first group corresponds to portions of a first equipment and the second group corresponds to portions of a second equipment, and wherein the first equipment and second equipment are subject to a same set of environmental conditions;

detect that the alarm condition for one of the one or more groups has been met; and in response to detecting that the alarm condition for one of the one or more groups has been met, provide an operator alert that the alarm condition for the one of the one or more groups has been met.

11. The apparatus of claim 10, wherein the at least one processor is configured to
convert at least one of the plurality of data values to a temperature value.

12. The apparatus of claim 10, further comprising a display that shows an image of the scene provided by the IR camera and a visual indication of the plurality of fixed, non-overlapping areas.

13. The apparatus of claim 12, wherein a hue or intensity of a pixel of the image represents a static data value or a static range of values corresponding to a temperature or a range of temperatures of the electrical equipment at that location in the image.

14. The apparatus of claim 13, wherein the at least one processor is further configured to adjust an intensity map or color map of the image to increase a range or sensitivity of the data values being represented to the user.

15. The apparatus of claim 13, wherein the at least one processor is further configured to map a sub-range of data values to a single color or intensity value.

16. The apparatus of claim 13, wherein the at least one processor is further configured to display data values in a first sub-range in color and to display data values in a second sub-range in grayscale or black and white.

17. The apparatus of claim 13, wherein the at least one processor is further configured to acquire at least one additional data value from a sensor that is attached to the electrical equipment to be monitored and assign the at least one additional data value to at least one of the one or more groups.

* * * * *